US008218785B2

(12) United States Patent
Von Wiegand

(10) Patent No.: US 8,218,785 B2
(45) Date of Patent: Jul. 10, 2012

(54) CONVERSATION ASSISTANT FOR NOISY ENVIRONMENTS

(75) Inventor: Thomas E. Von Wiegand, Billerica, MA (US)

(73) Assignee: Sensimetrics Corporation, Malden, MA (US)

( * ) Notice: Subject to any disclaimer, the term of this patent is extended or adjusted under 35 U.S.C. 154(b) by 383 days.

(21) Appl. No.: 12/434,410

(22) Filed: May 1, 2009

(65) Prior Publication Data

US 2010/0142722 A1 Jun. 10, 2010

Related U.S. Application Data

(60) Provisional application No. 61/126,306, filed on May 5, 2008, provisional application No. 61/169,535, filed on Apr. 15, 2009.

(51) Int. Cl.
*H03B 3/00* (2006.01)

(52) U.S. Cl. ................ 381/77; 381/2; 381/79; 381/331; 455/41.1; 455/41.2

(58) Field of Classification Search ................ 381/2, 12, 381/16, 77, 78, 331; 455/3, 421; 445/41.2; 398/96, 119, 127, 129
See application file for complete search history.

(56) References Cited

U.S. PATENT DOCUMENTS

| | | | |
|---|---|---|---|
| 4,648,131 | A | 3/1987 | Kawaguchi et al. |
| 4,977,619 | A | 12/1990 | Crimmins |
| 5,027,433 | A | 6/1991 | Menadier et al. |
| 5,095,382 | A | 3/1992 | Abe |
| 5,218,641 | A | 6/1993 | Abe et al. |
| 5,319,190 | A | 6/1994 | Allen et al. |
| 5,548,654 | A | 8/1996 | Fast |
| 5,623,358 | A | 4/1997 | Madey |
| 5,757,530 | A | 5/1998 | Crandall, Jr. |
| 5,905,464 | A | 5/1999 | Lanciaux |
| 6,006,115 | A | 12/1999 | Wingate |

(Continued)

FOREIGN PATENT DOCUMENTS

| | | |
|---|---|---|
| JP | 1994-120903 | 4/1994 |

(Continued)

OTHER PUBLICATIONS

MDR-IF240RK Wireless Headphone System, Sony Corporation, 2004, www.wireless-headphones.net/sony_mdr-if240rk.html, May 28, 2009, 3 pages.

(Continued)

*Primary Examiner* — Dung A. Le
(74) *Attorney, Agent, or Firm* — Wilmer Cutler Pickering Hale and Dorr LLP

(57) ABSTRACT

An infrared (IR) emitter having a broad emission pattern driven by a frequency-modulated (FM) carrier signal enables electronic communication between multiple talkers and multiple listeners. A narrow reception pattern on the listener's receiving unit combined with the inherent capture effect of FM coding provides each listener with the means of easily and naturally selecting one of many talkers from a group. A close microphone for the talking party and a close earphone for the listening party enables the system to assist conversation particularly in the case of noisy environments by improving the signal to noise ratio. A similar system of broad emission transmitters and narrow reception can be used in other systems, such as a teleconferencing unit in which users have transmitters and receivers and a teleconferencing unit has multiple receivers arranged to receive signals in multiple different sectors.

36 Claims, 4 Drawing Sheets

U.S. PATENT DOCUMENTS

| | | | | |
|---|---|---|---|---|
| 6,885,713 | B2 | 4/2005 | Olson et al. | |
| 6,893,346 | B2 | 5/2005 | Small et al. | |
| 6,968,062 | B1 | 11/2005 | Inanaga | |
| 7,095,981 | B1 * | 8/2006 | Voroba et al. ................ | 455/41.2 |
| 7,177,595 | B2 | 2/2007 | Hamada et al. | |
| 7,206,426 | B1 | 4/2007 | Julstrom et al. | |
| 7,209,704 | B2 * | 4/2007 | Kobata et al. ................ | 455/41.1 |
| 7,356,308 | B2 | 4/2008 | Hamada et al. | |
| 7,522,740 | B2 | 4/2009 | Julstrom et al. | |
| 2007/0021915 | A1 * | 1/2007 | Breed et al. ................... | 701/301 |

FOREIGN PATENT DOCUMENTS

| | | |
|---|---|---|
| JP | 2002044029 | 2/2002 |

OTHER PUBLICATIONS

Link-It Array Microphone System, Etymotic Research, Inc., 2000-2009, www.etymotic.com/ha/linkit.aspx, May 28, 2009, 1 page.

HB60 Infrared Clip-On Wireless Headphones, Koss Corporation, 2006, www.koss.com/koss/kossweb.nsf/p?openform&pc^wl^HB60, May 28, 2009, 2 pages.

Personal Sound Enhancer, Comlink Products, LLC, 2007, www.comlinksproducts.com, May 28, 2009, 2 pages.

International Search Report of the International Searching Authority of the Korean Intellectual Property Office for PCT/US2009/042582, mailing date of Dec. 30, 2009, 3 pages.

* cited by examiner

CONVERSATION ASSISTANT FOR NOISY ENVIRONMENTS

CROSS-REFERENCE TO RELATED APPLICATIONS

This application claims priority to U.S. Provisional Application 61/126,306, filed May 5, 2008, and U.S. Provisional Application No. 61/169,535 filed Apr. 15, 2009, the entire contents of each of which are incorporated herein by reference.

BACKGROUND

I. Field of the Invention

The present invention relates to wireless communication systems and methods, and in particular to assistive listening systems that facilitate communication in noisy environments.

II. Discussion of Related Art

To facilitate communication in noisy environments, wireless systems may be used to effectively receive and transmit audio signals. In such systems, sounds produced by an audio source are modulated and transmitted wirelessly over, for example, an infrared (IR) or radio signal. At the destination, this signal is intercepted by a receiver that reconstructs the original sounds and plays them back. This method is employed by many commercially-available headphone systems such as the Sony MDR-IF240RK Wireless Headphone System and the Koss HB60 Infrared Clip-On Wireless Headphones.

This method can be used for two-way communication as well. Headsets like the Etymotic Research Link-It and the Comlink Personal Sound Enhancer can produce audio signals using a microphone and wireless transmitter and can also receive signals using a built-in wireless receiver and earpiece speaker.

However, many-to-many communication presents complexities that do not arise in the unidirectional and bidirectional cases described above. An impediment to the development of a system for multi-way signal transmission is the problem of co-channel interference. Traditional signal transmission using amplitude, frequency, or phase modulation of radio-frequency carriers is designed to work with one carrier signal at a time. Mixing multiple carriers in a demodulator can result in badly distorted output.

SUMMARY

Systems and methods are described here for wireless communication, including multi-way wireless communication that reduces distortion caused by co-channel interference. A talker's speech is picked up by an individual body-worn microphone and transmitted wirelessly over a relatively wide angle, but short range. Each listener wears a receiver that has a narrow reception angle. The received signal can be converted to an acoustic signal by an earphone. Each person in the conversation can have both a transmitter and a receiver, enabling multi-way wireless signal transmission for speech communication in noisy settings.

The use of a directional receiver allows the use of a simple frequency modulation (FM) scheme and provides the user with a mechanism for selecting the source to be heard. The directionality of the receiver reduces the problem of signal distortion.

A directional receiver will attenuate sources outside of a limited angular range relative to those within the limited angular range, e.g., angles relative to a straight-ahead direction, but there can still be some mixing of modulated carriers. However, FM is known to be highly resistant to co-channel interference because of an effect called "FM capture." The capture effect is responsible for the much higher quality and noise-immune reception of an FM radio broadcast compared to AM.

The high degree of directionality that can be easily achieved with an IR receiver, e.g., by use of a lens or shaped 'blinders', together with the strength of the FM capture effect, supports the use of FM to facilitate this multi-way application.

In other embodiments, a receiving system can have multiple directional IR receivers for dividing a room or other region into sectors, and an FM demodulator (individually, or separate circuits collectively) for receiving IR signals in each region and providing them to other equipment, such as a recording device or a transmission device, e.g., as part of a teleconferencing system.

Other features and advantages will become apparent from the following detailed descriptions and drawings.

DETAILED DESCRIPTION

Figure 1:
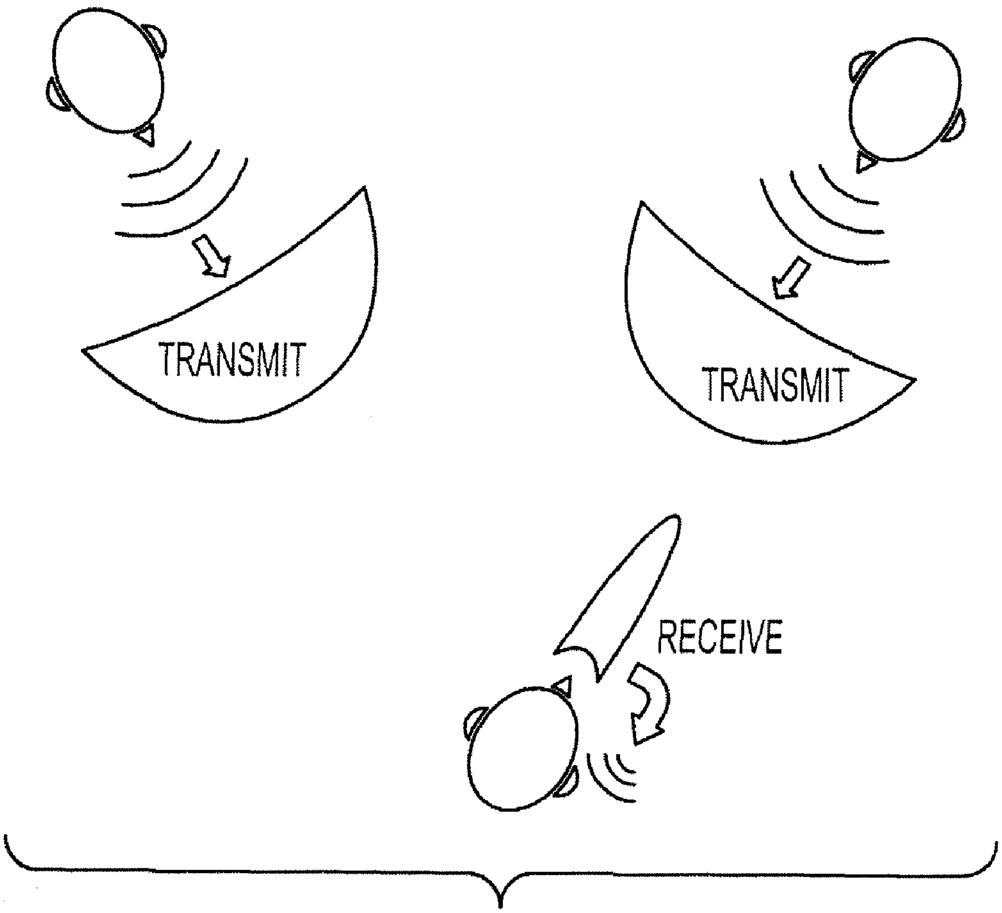
FIG. 1 is a diagrammatic representation of the light and information flow in an embodiment of a wireless communications system.

FIG. 1 shows a diagrammatic representation of the light and information flow in an embodiment of a wireless communication system. Multi-way signal transmission is achieved using infra-red (IR) signal transmission. As shown in FIG. 1, two talkers transmit over a wide angular range, while the listener receives over a more limited angular range, so that (as shown) the listener is substantially only receiving from one of the two talkers. In a receiver, the directionality of IR can be easily manipulated, e.g., through the use of a lens or blinders. Making the receiver directional achieves two goals: (1) it provides a natural mechanism for a listener to select the talker to be heard (for example, by attaching the system to the head, selection is effected via turning the head toward the desired talker); and (2) by reducing co-channel interference, it allows frequency modulation (FM) of a single carrier frequency to be used for all channels. The operational simplicity of this approach enables low-cost and easy-to-use assistive listening products.

Figure 2:
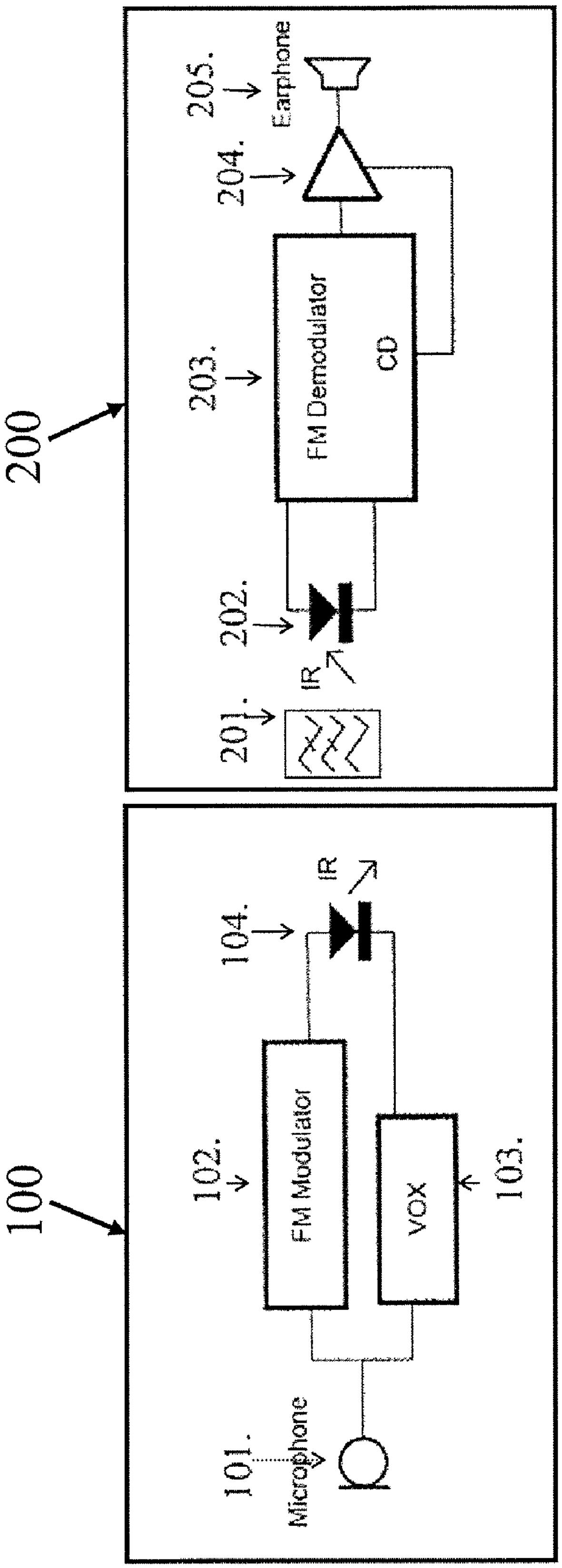
FIG. 2 is a block diagram according to an embodiment of the wireless communications system.

A simplified block diagram of the transmitter subsystem 100 and the receiver subsystem 200 is shown in FIG. 2. In the transmitter subsystem 100, a directional microphone 101 is coupled to a modulation input of an FM Modulator 102, and can also be coupled to an input of a Voice Operated Switch (VOX) 103. The FM Modulator drives an IR LED 104. To save energy and battery power, the VOX can be used to enable the LED output only when speech is present; i.e., the transmitter is powered up when speech is detected and powered down when speech is not detected. In the receiver subsystem 200, an optical filter 201 is used to admit a desired set of wavelengths, such as near IR, and reject other wavelengths of light. A photodiode 202 produces a signal that provides input to an FM Demodulator 203 that provides a Carrier Detect (CD) signal to un-mute the output. The demodulated audio is amplified in amplifier 204 and provided to the user, e.g., through an earphone 205 when a valid carrier is being received. The receiver can be made directional, e.g., by using a lens or blinders over the photodiode or over the filter and photodiode. A power source (not shown) is used to operate the system, which may be internal to any of the subcomponents, or power may be conveyed from an external source.

Figure 3A:
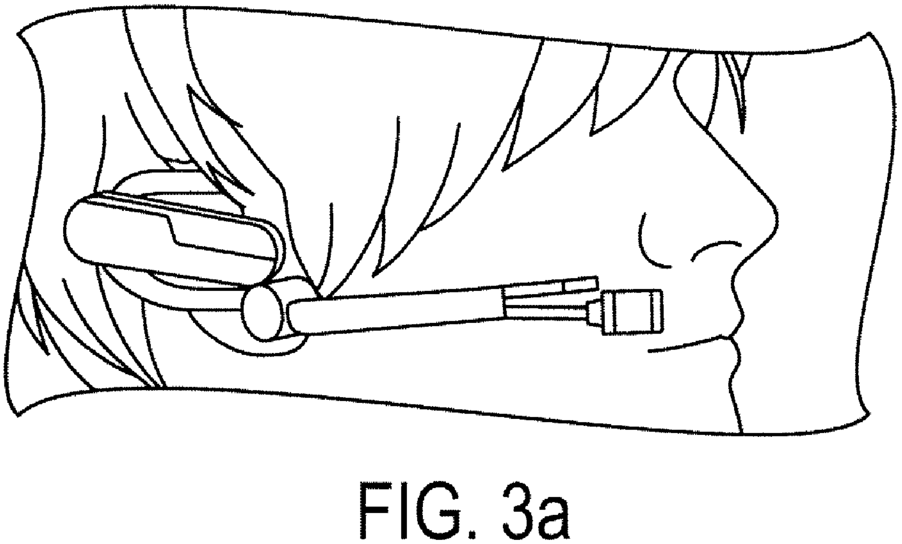
FIGS. 3*a* and FIG. 3*b* contain photographs illustrating an embodiment of a transmitter and receiver.
Figure 3B:
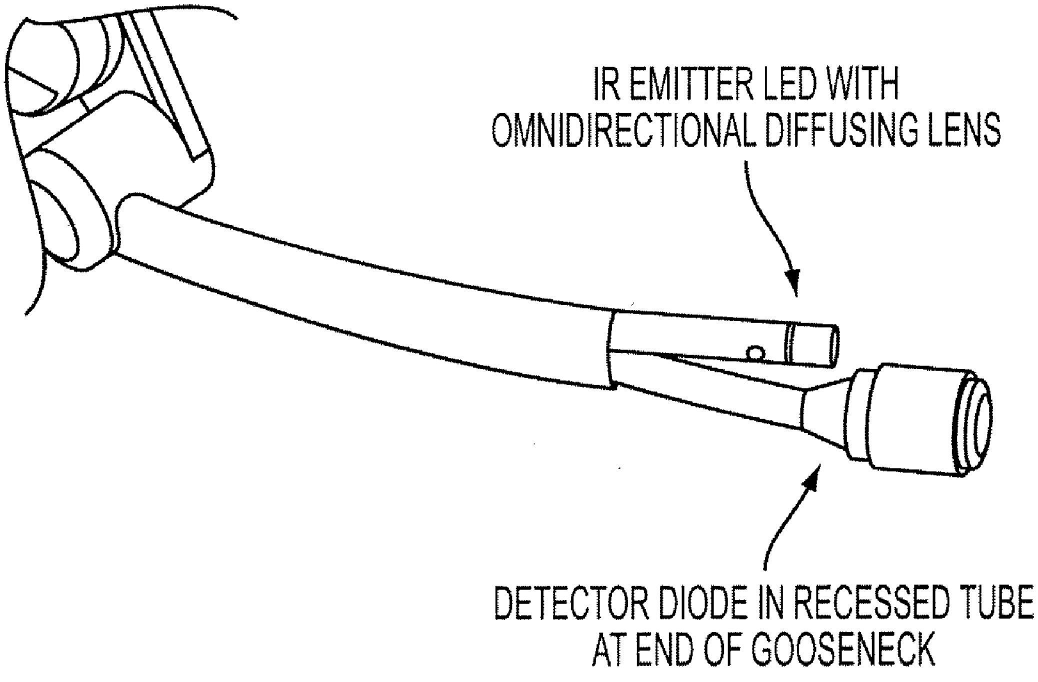

FIGS. 3*a* and 3*b* show an embodiment including a one-piece unit utilizing a short bifurcated boom. The boom can be constructed so as not to impede the view of and access to the mouth during eating. The boom contains a noise-canceling microphone. The photodiode receiver is located on a flexible gooseneck to accommodate situations such as automobile travel when the talker is not in front of the listener. The receiver can be provided within a tube with a geometry that defines a limited angular range of reception. The gooseneck would normally be oriented in the same direction as the IR emitter support prong in order to facilitate easy aiming by pointing the head in the general direction of the talker. An earpiece can be designed to permit left or right ear operation.

The unit can have fixed horizontal and also vertical angles of reception that receive signals in a limited angular range while substantially attenuating signals received from sources at other angles outside that range. In other embodiments, the unit can include controls that allow the user to adjust the vertical and horizontal reception angles of the receiver. Wider reception angles provide increased freedom of movement by allowing for the vertical and horizontal head motions of the user. On the other hand, using a wider reception angle can sacrifice some of the benefits of directionality. The horizontal angle can be up to +/−45° from a center line, and be variable in a range that is within a range of about +/−10° to +/−45° from a center line (e.g., in front of the user), or within a range within about +/−20° up to +/−35° from a center line. A vertical angle can be up to about +/−45°, or some smaller angle. The controls can operate in a continuous manner, such as moving a microphone continuously within a tube, or through a set of discrete steps. The control can be implemented by altering the receiver from one setting to another, or by using multiple receivers with different characteristics such that the control selects one of the receivers to use. The controls can be operated and adjusted by a user during operation, or they can be used to set angular parameters in advance for all later uses.

Testing with a talker equipped with a microphone and IR transmitter, and a listener at a distance of 1 meter equipped with an IR receiver and earphone, indicates that speech-to-noise ratio is improved by approximately 20 dB over that of the direct acoustic signals measured at the ears of the listener. This improvement can generally be maintained with a vertical reception angle of +/−45° and a horizontal reception angle of +/−20° for a full angle of about 40°. However, the ideal reception angle depends on user preferences and environmental conditions, and the user can use the angle controls to adjust the device accordingly.

Figure 4:
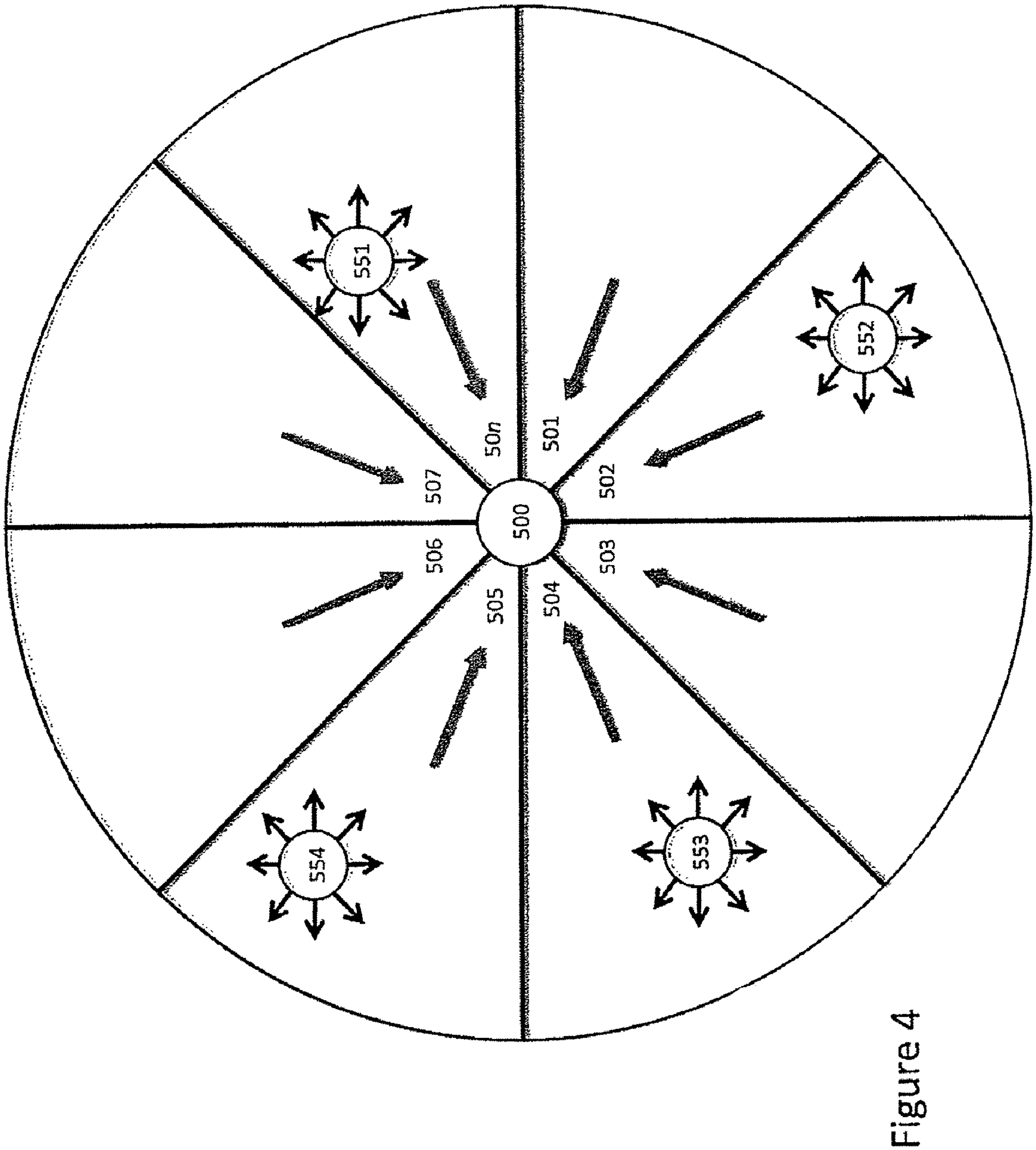
FIG. 4 is a schematic of another embodiment of an embodiment for creating receiving sectors.

FIG. 4 shows another application in which up to n transmitters can communicate with a single input audio device, such as a line input of a tape recorder or a transmission system of a teleconferencing system. Transmitters 551, 552, 553, and 554, which can represent users and have substantially the same construction as subsystem 100 (FIG. 2), are distributed throughout the room. A multi-channel conference unit 500 has directional receivers 501-50*n*, that effectively divide the area into sectors, e.g., eight sectors, and receive signals transmitted by transmitters 551-554. The sectors can be designed to have little overlap between them. In cases where there is one transmitter in a sector, that transmitter is unambiguously selected. In the case where there are multiple transmitters in a sector, the strongest transmitter is automatically selected due to the capture ratio characteristics of the FM modulation. The circuitry within each directional IR receiver would include an FM demodulator. In this system, multiple transmitters operating on a single carrier frequency can be automatically selected based on their direction relative to the conference unit without recourse to manual frequency or code setting.

FIG. 4 also represents a conferencing application, such as telephone conferencing, in which the users are equipped with IR receivers having relatively narrow reception patterns, as pictured in FIG. 1, in addition to broad-angle IR transmitters. The multi-channel conference unit 500 also has omnidirectional IR emission, in addition to the multiple narrow reception directions 501-50*n* shown here as sectors. Each look direction of the multi-channel conference unit 500 will typically receive at most one valid signal from one of the individual transmitter systems 551-554. Look directions containing a valid signal, as indicated internally by a carrier detect signal, will cause that signal to be switched onto a common mixing bus to be sent out to the telephone or other conferencing input.

Since each of the individual transmitter systems 551-554 uses a Voice Operated Switch (VOX) to switch on its omnidirectional emission, the carrier detect signals within the multi-channel conference unit 500 will be active only when the given look direction is in view of an individual transmitter system that is actively conveying speech sounds, thus enabling the common mixing bus to contain only active speech signals and reducing room noise from open microphones having no active speech.

In this conferencing system, the individual units 551-554 function as described above, with broad or omnidirectional emission and relatively narrow reception, as pictured in FIG. 1. A user merely points the unit (aims his or her head) at the user they wish to hear. They may also in the same way point their unit at the telephone unit when they wish to hear the telephone.

It will be appreciated that the scope of the present invention is not limited to the above-described embodiments, but rather is defined by the appended claims; and that these claims will encompass modifications of and improvements to what has been described. For example, different configurations of transmitter and receiver can be used on an individual.

The invention claimed is:

1. A wireless communication system comprising:

an assembly including:

a directional infrared receiver for receiving incoming infrared waves, where the receiver is operable to substantially receive infrared waves that originate from sources substantially in a limited angular range, and where the receiver attenuates infrared waves from sources outside the limited angular range; and a demodulator for demodulating said incoming infrared waves to form demodulated audio signals; and a plurality of infrared transmitters, wherein said incoming infrared waves are emitted by the infrared transmitters;

the assembly configured to substantially receive infrared waves from one of the plurality of transmitters.

2. The system of claim 1, further comprising an earpiece speaker for providing said demodulated audio signals to a listening user.

3. The system of claim 1, further comprising a plurality of directional receivers for receiving signals from different angles, wherein signals received by the plurality of directional receivers are provided to an audio device.

4. The system of claim 1, further comprising a plurality of directional receivers for receiving signals from different angles, wherein signals received by the plurality of directional receivers are provided to a teleconferencing system.

5. The system of claim 1, wherein the demodulator includes an FM demodulator.

6. A system comprising:

a first portable assembly for a user including:

a directional infrared receiver for receiving incoming infrared waves, where the receiver is operable to substantially receive infrared waves that originate from sources substantially in a limited angular range, and where the receiver attenuates infrared waves from sources outside the limited angular range;

a demodulator for demodulating said incoming infrared waves to form demodulated audio signals;

a speaker for providing said demodulated audio signals to a listening user;

a microphone for converting speech received from a talking user into electrical signals;

a modulator for modulating said electrical signals to produce modulated signals for transmission using infrared energy; and an outgoing infrared transmitter for emitting said modulated signals as outgoing infrared waves radiating omnidirectionally from said outgoing infrared transmitter.

7. The system of claim 6, the first portable assembly further comprising a voice operated switch that powers up the outgoing infrared transmitter when speech is received from the talking user and powers down the outgoing infrared transmitter when speech is no longer being received from the talking user.

8. The system of claim 6, wherein the first portable assembly further comprises a vertical angle control for adjusting a vertical angular range of the infrared receiver.

9. The system of claim 6, wherein the vertical angular range of the infrared receiver can be adjusted within an angular range from ±10° to ±45°.

10. The system of claim 6, further comprising:

a second portable assembly for a second user including:

a second directional infrared receiver for receiving incoming infrared waves, where the receiver is operable to receive infrared waves that originate from sources substantially in a limited angular range relative to the direction in which the user is facing, and where the receiver attenuates infrared waves from sources outside the angular range;

a second demodulator for demodulating said incoming infrared waves to form demodulated audio signals; and a second speaker for providing said demodulated audio signals to the user.

11. The system of claim 6, wherein there are at least three similar portable assemblies, each consisting essentially of the microphone, the transmitter, the modulator, the directional infrared receiver, the demodulator, and the speaker for providing said demodulated audio signals to a listening user.

12. The system of claim 11, further comprising a voice operated switch coupled to the microphone.

13. The system of claim 6, the first portable assembly further comprising a voice operated switch coupled to the microphone.

14. The system of claim 6, wherein the modulator includes an FM modulator.

15. The system of claim 6, further comprising a plurality of infrared transmitters, wherein said incoming infrared waves are emitted by said plurality of incoming infrared transmitters.

16. The system of claim 6, further comprising second and third portable assemblies, each substantially similar to the first portable assembly, for respective second and third users.

17. A wireless communication system comprising:

a directional infrared receiver for receiving incoming infrared waves, where the receiver is operable to substantially receive infrared waves that originate from sources substantially in a limited angular range, and where the receiver attenuates infrared waves from sources outside the limited angular range;

a demodulator for demodulating said incoming infrared waves to form demodulated audio signals; and a horizontal angle control for adjusting a horizontal angular range of the infrared receiver.

18. The system of claim 17, wherein the horizontal angular range of the infrared receiver can be adjusted within the range from ±10° to ±45°.

19. The system of claim 17, wherein the horizontal angular range of the infrared receiver can be adjusted within the range from ±20° to ±35°.

20. The system of claim 17, wherein the communications device further comprises a vertical angle control for adjusting the vertical angular range of the infrared receiver.

21. A method for allowing a user of a wireless communications device to engage in a conversation with one or more parties, where the communications device includes a portable assembly that includes an infrared receiver and a demodulator, the method comprising:

receiving incoming infrared waves using the infrared receiver, where the receiver is operable to substantially receive infrared waves that originate from sources substantially in a limited angular range relative to the direction in which the user is facing, and where the receiver attenuates infrared waves from sources outside the limited angular range;

demodulating said incoming infrared waves using the demodulator to form demodulated audio signals;

providing said demodulated audio signals to a listening user;

converting speech received from a talking user into electrical signals using a microphone;

modulating said electrical signals to produce modulated signals for transmission using infrared energy; and emitting said modulated signals as outgoing infrared waves radiating omnidirectionally from said outgoing infrared transmitter.

22. The method of claim 21, further comprising adjusting a vertical angular range of the infrared receiver, in response to a change to a vertical angle control located on said portable assembly.

23. The method of claim 21, wherein the incoming infrared waves are emitted by a plurality of infrared transmitters.

24. The method of claim 21, wherein the demodulator includes an FM demodulator.

25. A method for allowing a user of a wireless communications device to engage in a conversation with one or more parties, where the communications device is a portable assembly that includes an infrared receiver and a demodulator, the method comprising:

receiving incoming infrared waves using the infrared receiver, where the receiver is operable to substantially receive infrared waves that originate from sources substantially in a limited angular range relative to the direction in which the user is facing, and where the receiver attenuates infrared waves from sources outside the limited angular range;

demodulating said incoming infrared waves using the demodulator to form demodulated audio signals;

providing said demodulated audio signals to a listening user; and adjusting a horizontal angular range of the infrared receiver, in response to a change to a horizontal angle control located on said portable assembly.

26. The method of claim 25, further comprising adjusting a vertical angular range of the infrared receiver, in response to a change to a vertical angle control located on said portable assembly.

27. A wireless speech communication system comprising:

a plurality of directional infrared receivers facing radially outward from a central location, where each infrared receiver is operable to receive infrared waves that originate from sources substantially within a limited angular range;

a plurality of demodulators for demodulating said incoming infrared waves to form demodulated audio signals;

a mixing bus for mixing said demodulated audio signals to form an aggregated signal.

28. The system of claim 27, the system further comprising a plurality of transmitters, each including:

a microphone for receiving an audio signal, a modulator for modulating the audio signal to produce modulated signals for transmission using infrared energy; and an infrared transmitter for emitting said modulated signals as outgoing infrared waves radiating omnidirectionally from the transmitter, such that the infrared waves can be received by at least one of the plurality of directional infrared receivers.

29. The system of claim 28, wherein each transmitter is associated with a receiver that includes:

a directional infrared receiver for receiving incoming infrared waves, where the receiver is operable to substantially receive infrared waves that originate from sources substantially in a limited angular range, and where the receiver attenuates infrared waves from sources outside the limited angular range; and a demodulator for demodulating said incoming infrared waves to form demodulated audio signals.

30. The system of claim 27, further comprising a line out for conveying said aggregated signal to an external device.

31. The system of claim 27, wherein the plurality of directional receivers are oriented such that there is substantially no overlap among the areas covered by each of the infrared receivers.

32. The method of claim 27, wherein the demodulators include FM demodulators.

33. The system of claim 27, further comprising a plurality of infrared transmitters, wherein said incoming infrared waves are emitted by said plurality of incoming infrared transmitters.

34. A method for allowing a user of a wireless communications device to engage in a conversation with one or more parties, where the communications device includes an infrared receiver and a demodulator, the method comprising:

receiving incoming infrared waves using the infrared receiver from a plurality of infrared transmitters, where the receiver is operable to substantially receive infrared waves that originate from transmitters substantially in a limited angular range relative to the direction in which the user is facing, and where the receiver attenuates infrared waves from transmitters outside the limited angular range;

demodulating said incoming infrared waves using the demodulator to form demodulated audio signals; and providing said demodulated audio signals to a listening user.

35. The method of claim 34, wherein the communications device further comprises a voice operated switch, the method further comprising, in response to receiving speech from the user, the voice operated switch powering-up the IR transmitter.

36. The method of claim 34, wherein the demodulator includes an FM demodulator.

* * * * *